United States Patent
Zanbaghi et al.

(10) Patent No.: US 11,012,043 B2
(45) Date of Patent: May 18, 2021

(54) HYBRID AUTOZEROING AND CHOPPING OFFSET CANCELLATION FOR SWITCHED-CAPACITOR CIRCUITS

(71) Applicant: Cirrus Logic International Semiconductor Ltd., Edinburgh (GB)

(72) Inventors: Ramin Zanbaghi, Austin, TX (US); Eric Kimball, Austin, TX (US); Sai Srujana Vuppala, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/544,815

(22) Filed: Aug. 19, 2019

(65) Prior Publication Data

US 2021/0058046 A1 Feb. 25, 2021

(51) Int. Cl.
*H03F 3/45* (2006.01)

(52) U.S. Cl.
CPC ..... *H03F 3/45475* (2013.01); *H03F 3/45941* (2013.01); *H03F 3/45977* (2013.01); *H03F 2203/45212* (2013.01)

(58) Field of Classification Search
CPC ........................................................ H03F 3/45
USPC ..................................................... 330/9, 260
See application file for complete search history.

(56) References Cited

U.S. PATENT DOCUMENTS

| | | | |
|---|---|---|---|
| 5,016,280 A | 5/1991 | Engebretson et al. | |
| 5,479,130 A | 12/1995 | McCartney | |
| 5,491,623 A | 2/1996 | Jansen | |
| 5,617,058 A | 4/1997 | Adrian et al. | |
| 5,727,037 A | 3/1998 | Maneatis | |
| 6,476,671 B1 | 11/2002 | Tang | |
| 6,700,518 B2 | 3/2004 | Kishida | |
| 7,129,714 B2 | 10/2006 | Baxter | |
| 7,295,077 B2 | 11/2007 | Thomsen et al. | |
| 7,589,587 B2 * | 9/2009 | Yoshida | H03F 3/387 330/258 |
| 7,894,789 B2 | 2/2011 | Sorrells et al. | |

(Continued)

OTHER PUBLICATIONS

Wikipedia. "Noise shaping." Retrieved from https://en.wikipedia.org/w/index.php?title=Noise_shaping&oldid=834053393. Page was last edited on Apr. 3, 2018. pp. 1-4.

(Continued)

*Primary Examiner* — Henry Choe
(74) *Attorney, Agent, or Firm* — E. Alan Davis; James W. Huffman

(57) ABSTRACT

A system has an output and receives an input signal. An operational amplifier has an input, an output and an offset at the input. A switched capacitor network samples the input signal at a switched capacitor frequency. An autozeroing capacitor connected to the input of the operational amplifier captures the offset during an offset capture interval according to an autozeroing frequency. Chopping and autozeroing switches, connected between the autozeroing capacitor and the switched capacitor network, chop the sampled input signal according to a chopping frequency and autozero the captured offset according to the autozeroing frequency. De-chopping switches, connected between the output of the operational amplifier and the output of the system, operate on the output of the operational amplifier at the chopping frequency to chop the autozeroed captured offset and de-chop the chopped sampled input signal processed by the operational amplifier.

21 Claims, 6 Drawing Sheets

(56) References Cited

U.S. PATENT DOCUMENTS

| | | | |
|---|---|---|---|
| 8,198,937 B1 * | 6/2012 | Vilas Boas | H03F 3/45475 330/9 |
| 9,225,368 B2 | 12/2015 | Nienaber | |
| 9,401,725 B2 | 7/2016 | Lenz | |
| 2019/0377034 A1 | 12/2019 | Kimball | |

OTHER PUBLICATIONS

Mosser, Vincent et al. "A Spinning Current Circuit for Hall Measurements Down to the Nanotesla Range." IEEE Transactions on Instrumentation and Measurement, vol. 66, No. 4. Apr. 2017. pp. 637-650.

* cited by examiner

HYBRID AUTOZEROING AND CHOPPING OFFSET CANCELLATION FOR SWITCHED-CAPACITOR CIRCUITS

BACKGROUND

Operational amplifiers are ubiquitous in electronics. Operational amplifiers, or op amps, are differential input electronic amplifiers characterized by a very large open-loop gain and input resistance, and a very small output resistance. It is very difficult to design an operational amplifier without an offset. An offset is a direct current (DC) and/or low frequency value introduced in the output of an amplifier that was not present in the input. Offset is frequently caused by temperature drift, circuit element mismatch due to manufacturing process imprecision, and layout errors. Switched capacitor operational amplifier circuits are very useful, particularly when employed in complementary metal oxide semiconductor (CMOS) technology.

SUMMARY

Embodiments of a combined autozeroing (AZ) and chopping technique for operational amplifier-based switched capacitor circuits are described.

In one embodiment, the present disclosure provides a system having an output and that receives an input signal. The system includes an operational amplifier having an input, an output and an offset at the input. The system also includes a switched capacitor network that samples the input signal at a switched capacitor frequency. The system also includes an autozeroing capacitor connected to the input of the operational amplifier that captures the offset during an offset capture interval according to an autozeroing frequency. The system also includes chopping and autozeroing switches, connected between the autozeroing capacitor and the switched capacitor network, that chop the sampled input signal according to a chopping frequency and that autozero the captured offset according to the autozeroing frequency. The system also includes de-chopping switches, connected between the output of the operational amplifier and the output of the system. The de-chopping switches operate on the output of the operational amplifier at the chopping frequency to chop the autozeroed captured offset and de-chop the chopped sampled input signal processed by the operational amplifier.

In another embodiment, the present disclosure provides a method for cancelling an offset at an input of an operational amplifier in a system also having a switched capacitor network that receives an input signal. The method includes sampling, by the switched capacitor network, the input signal at a switched capacitor frequency. The method also includes capturing, by an autozeroing capacitor, the offset during an offset capture interval according to an autozeroing frequency. The method also includes chopping the sampled input signal according to a chopping frequency and autozeroing the captured offset according to the autozeroing frequency. The method also includes chopping, at the chopping frequency, the autozeroed captured offset at an output of the operational amplifier. The method also includes de-chopping, at the chopping frequency, the chopped sampled input signal processed by the operational amplifier.

DETAILED DESCRIPTION

Figure 1:
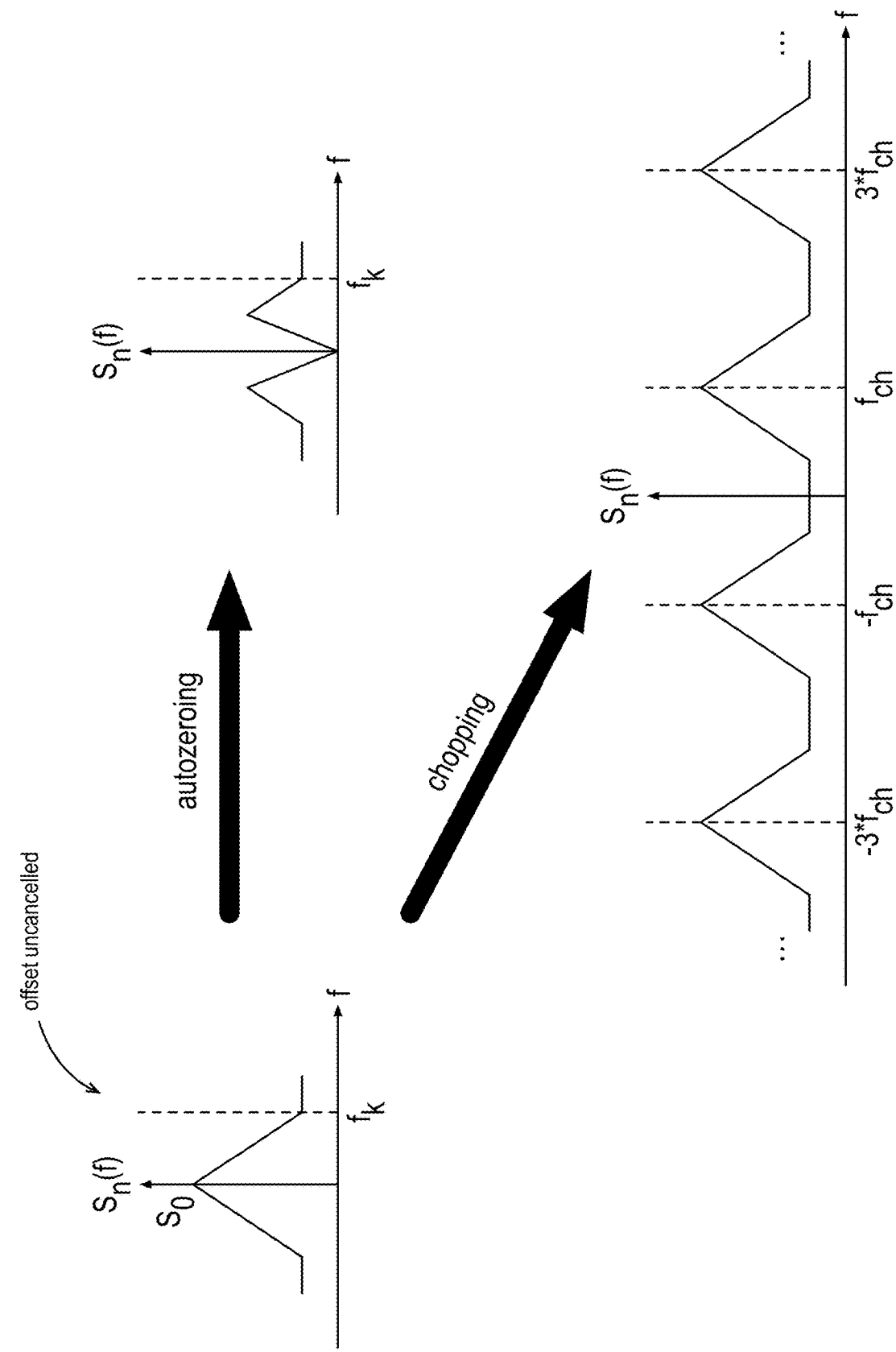
FIG. 1 is three example graphs used to illustrate the effects of autozeroing and of chopping, individually, on an offset of an operational amplifier.

FIG. 1 is three graphs used to illustrate the effects of autozeroing and of chopping, individually, on an offset of an operational amplifier. Each graph depicts the magnitude (e.g., power spectrum density, $S_n(f)$) of the offset of an operational amplifier in the output signal of the system as a function of frequency (f). The upper left-hand graph of FIG. 1 illustrates uncancelled, or unattenuated, offset of an operational amplifier. As used herein, the input offset of an operational amplifier refers to both a direct current (DC) component (e.g., So of the upper left-hand graph of FIG. 1) and a flicker noise component, i.e., a static component and a moving component. Flicker noise of the operational amplifier (also known as 1/f noise and pink noise) is low frequency noise whose power spectral density varies inversely with its frequency, as shown in the upper left-hand graph of FIG. 1.

Various techniques have been used to reduce the effects of input offset of operational amplifiers. A static technique to reduce operational amplifier offset is to use larger devices, e.g., larger transistors, capacitors, and/or resistors. This technique has the drawbacks of using additional chip area and consuming additional power. Another static technique is feedback factor reduction. This technique disadvantageously requires large operational amplifier gain bandwidth.

A dynamic technique for reducing offset is autozeroing which high-pass filters the offset, as described in more detail below. The upper right-hand graph of FIG. 1 illustrates the offset after application of autozeroing. As may be observed, the DC component is effectively eliminated by autozeroing, and the lower frequency portion of the flicker noise is also significantly reduced. A limitation of autozeroing is that the upper spectrum of the flicker noise remains intact, as may be observed from the upper right-hand graph of FIG. 1.

Another dynamic technique for reducing offset is chopping. The lower right-hand graph of FIG. 1 illustrates the offset after application of chopping. As may be observed, chopping is based on the principle of frequency translation. More specifically, the offset is spread to higher frequencies that are odd integer multiples of the chopping frequency. A drawback of chopping is the foldback of quantization noise (or any blocker frequencies) to the baseband through a non-linearity mechanism. Another drawback of chopping is that using a chopping frequency that is approximately ten times slower, for example, than the switched capacitor frequency Fa, creates a considerably large chopping ripple, which may cause an imperfection in the form of a summing node ripple. Advantageously, embodiments are described in which a hybrid technique of chopping an autozeroed captured offset at a chopping frequency that is higher than the autozeroing frequency and inside a switched capacitor frequency that is higher than both the chopping and autozeroing frequency is employed.

Figure 2:
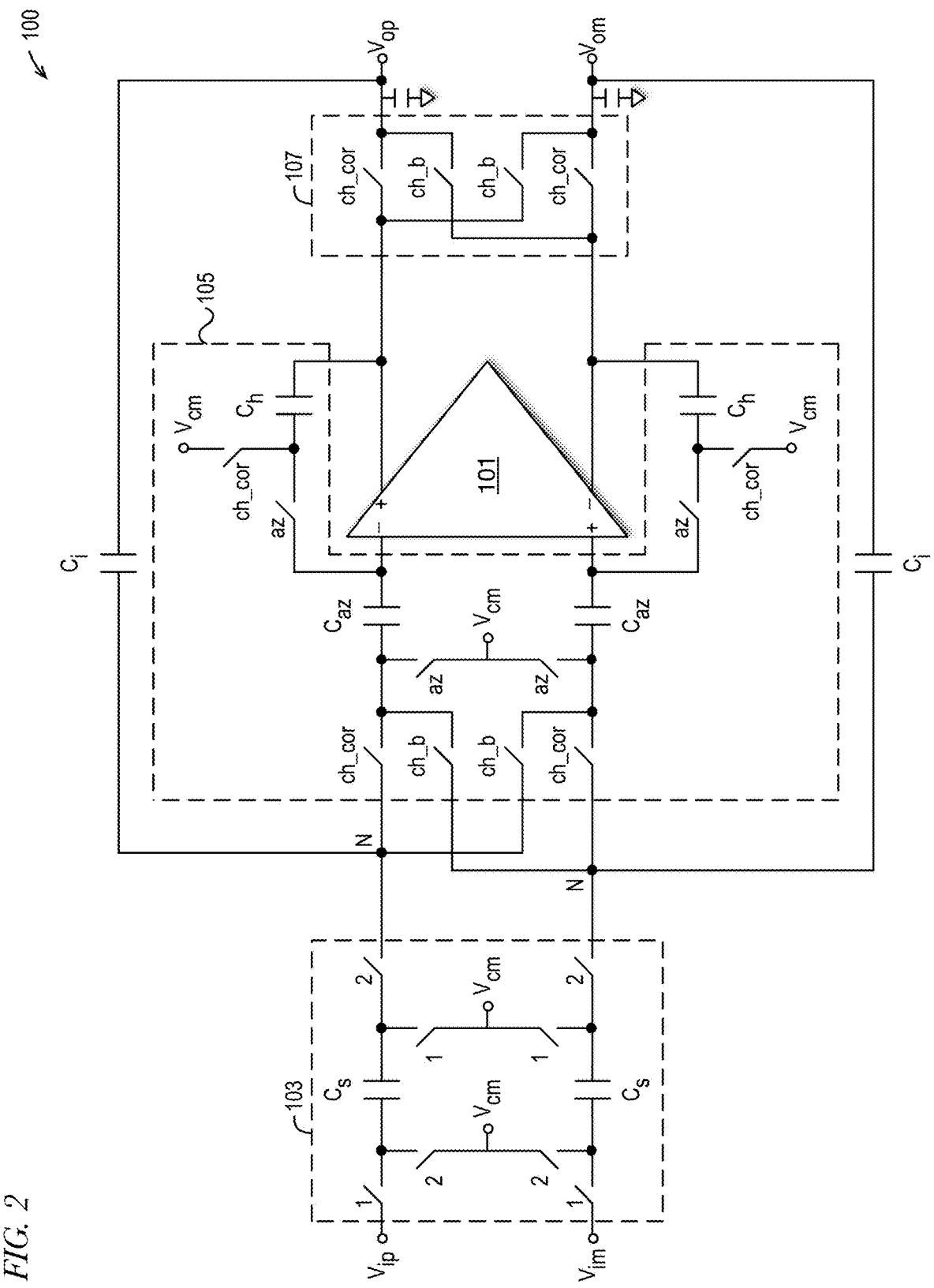
FIG. 2 is an example switched capacitor integrator system that performs hybrid autozeroing and chopping of a captured offset of an operational amplifier in accordance with an embodiment of the present disclosure.

FIG. 2 shows an example switched capacitor system 100 in accordance with an embodiment of the present disclosure. The switched capacitor system 100 includes an operational amplifier 101, switched capacitor circuitry 103, chopping and autozeroing circuitry 105, de-chopping switches 107 and integrating capacitors $C_i$ in accordance with embodiments of the present disclosure. In the embodiment of FIG. 2, the system 100 operates as a non-inverting integrator. However, other switched capacitor systems, such as gain stages, buffers, summers (see FIG. 6) and comparators (see FIG. 5) may employ the hybrid autozeroing and chopping offset cancellation circuitry described herein and enjoy the advantages thereof, which are described herein. In the embodiment of FIG. 2, the system 100 is fully differential having differential voltage input signals $V_{ip}$ and $V_{im}$ and differential voltage output signals $V_{op}$ and $V_{om}$; however, single-ended embodiments are also contemplated. Additionally, although the operational amplifier 101 in the embodiment of FIG. 2 is a voltage-controlled voltage source, other embodiments are contemplated in which the operational amplifier 101 is an operational transconductance amplifier (OTA) that operates as a voltage-controlled current source.

Figure 3:
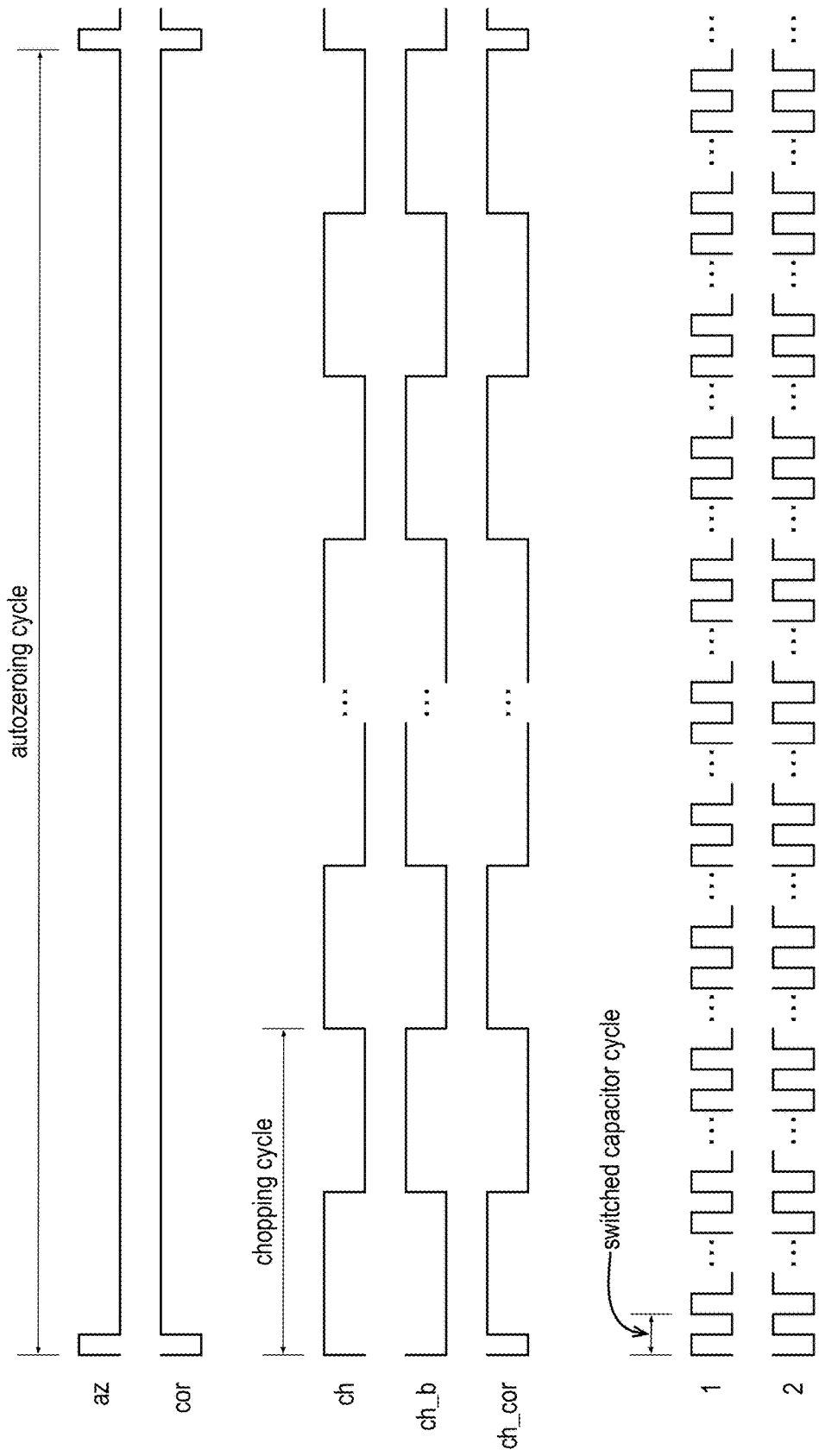
FIG. 3 is an example timing diagram illustrating operation of the system of FIG. 2 in accordance with an embodiment of the present disclosure.

The system 100 includes many switches. Each switch is labeled with a name of a control signal that controls the opening and closing of the switch. More specifically, the control signals are "1", "2", "ch_cor", "ch_b", and "az". An example embodiment of the control signals are illustrated in the timing diagram of FIG. 3, which is described in more detail below. In FIG. 3, an active (or high) control signal indicates the switch is closed and an inactive (or low) control signal indicates the switch is open. In the embodiment of FIG. 2, each switch has a complementary switch given the differential nature of the system 100. Below, the circuit elements (switches and capacitors) of one side (e.g., the positive side) of the differential system 100 will be described, and it should be understood that the other side (e.g., the negative side) has a mirror image of the elements of the side described.

The switched capacitor circuitry 103 includes switches 1 and switches 2 that are opened and closed according to two-phase clock signals 1 and 2 of FIG. 3. The switches 1 are closed when phase 1 is active, and the switches 2 are closed when phase 2 is active. The near side of a first switch 1 is connected to $V_{ip}$, and the far side is connected to a sampling capacitor $C_s$ that samples the input voltage during phase 1. During phase 2, the processing phase (e.g., integrating, amplifying, comparing, or buffering phase), the near side of the sampling capacitor $C_s$ is connected to a common mode bias voltage $V_{cm}$ by a first switch 2. The common mode bias voltage $V_{cm}$ may operate as a virtual ground. The far side of the sampling capacitor $C_s$ is connected to a second switch 2 whose other side is connected to a summing node N and to a second switch 1 that connects the far side of the sampling capacitor Cs to the common mode bias voltage $V_{cm}$ during phase 1. Thus, the switched capacitor circuitry 103 samples a value of the input voltage during phase 1, and during phase 2, provides the sampled value to the chopping and autozeroing circuitry 105, operational amplifier 101 and de-chopping switches 107 for processing. The far side of the integrating capacitor $C_i$ is connected to the output $V_{op}$ and the near side is connected to summing node N. As may be observed, advantageously the addition of the hybrid autozeroing and chopping offset cancellation circuitry does not require modification of the connection of the integrating capacitor $C_i$, which holds the integration data.

The chopping and autozeroing circuitry 105 includes a first switch ch_cor connected on the near side to the summing node N and on the far side to the near side of an autozeroing capacitor $C_{az}$. A first switch ch_b also connects the near side of the autozeroing capacitor $C_{az}$ to the opposite summing node N. A first switch az also connects the near side of the autozeroing capacitor $C_{az}$ to the common mode bias voltage $V_{cm}$. The far side of the autozeroing capacitor $C_{az}$ is connected to the input of the operational amplifier 101 and to the near side of a second switch az. The far side of the second switch az is connected to the near side of a holding capacitor $C_h$, whose far side is connected to the output of the operational amplifier 101. The near side of the holding capacitor $C_h$ is connected to the common mode bias voltage Vcm by a second switch ch_cor.

The de-chopping switches 107 include a third switch ch_cor that connects the output of the operational amplifier 101 and the output signal $V_{op}$. A second switch ch_b connects the opposite output of the operational amplifier 101 to the output signal $V_{op}$. As may be observed, in the embodiment of FIG. 2, the chopping switches 105 and de-chopping switches 107 are identical and are operated by identical control signals, except that the chopping switches 105 are connected to the input of the operational amplifier 101 (through the autozeroing capacitors $C_{az}$) and the de-chopping switches 107 are connected to the output of the operational amplifier 101 and both are connected to respective sides of the integrating capacitor $C_i$. In one embodiment, a low pass filter (not shown) is present at the output of the system 100 to filter out the chopped autozeroed input offset and any high frequency images created by the chopping and de-chopping of the input signal.

FIG. 3 is a timing diagram illustrating operation of the system 100 of FIG. 2 according to an embodiment of the present disclosure. The timing diagram shows levels for the following signals: az, cor, ch, ch_b, ch_cor, 1 and 2. Control signals 1 and 2 are clock signals that control the switched capacitor circuitry 103 switches 1 and 2 of FIG. 2. Clock signal 2 is the inverse of clock signal 1. The switched capacitor clock frequency is high relative to the chopping clock frequency, which is high relative to the autozeroing frequency, as shown. As shown, during the first half of the switched capacitor cycle, switched capacitor clock 1 goes high to connect the sampling capacitor $C_s$ to the input signal and to the common mode bias voltage $V_{cm}$ so the input signal is sampled on the sampling capacitor $C_s$. During the second half of the switched capacitor cycle, switched capacitor clock 2 goes high to connect the sampling capacitor $C_s$ to the summing node N and to the common mode bias voltage $V_{cm}$ so the sampled input signal is provided on the summing node N for processing by the operational amplifier 101 and integrating capacitor $C_i$, i.e., by the integrator 100.

Control signal az is a clock signal that controls switches az of the chopping and autozeroing circuitry 105 of FIG. 2 to accomplish autozeroing of the input offset of the operational amplifier 101 of FIG. 2. Signal cor is the inverse of clock signal az. As shown, an autozeroing cycle begins with a rising edge of a pulse of control signal az, and the autozeroing cycle ends at the rising edge of the next pulse of control signal az. More specifically, at the beginning of an autozeroing cycle, control signal az pulses to connect the autozeroing capacitor $C_{az}$ to the common mode bias voltage $V_{cm}$ (while disconnected from the summing node N as described below) so that the autozeroing capacitor $C_{az}$ captures the input offset of the operational amplifier 101. The autozeroed captured offset will be chopped over the course of the autozeroing cycle, as described more below. The duration of the az pulse may be referred to as an offset capture interval of the autozeroing cycle, whereas the remainder of the autozeroing cycle may be referred to as a correction interval of the autozeroing cycle during which the autozeroing capacitor $C_{az}$ effectively acts as a battery to cancel the effect of the input offset of the operational amplifier 101. Additionally, during the offset capture interval, the near side of the holding capacitor $C_h$ gets connected to the input of the operational amplifier 101 to provide a feedback path since the output gets disconnected during the offset capture interval by operation of the de-chopping switches 107, as described in more detail below. As shown, the duty cycle of control signal az is small since the pulse of control signal az is approximately the width of the switched capacitor clock pulse 1, which is small relative to the autozeroing clock cycle period, as shown in FIG. 2 and as described in more detail below.

Signal ch is a clock signal that determines the chopping frequency at which chopping of the autozeroed captured offset of the operational amplifier 101 in the system 100 of FIG. 2 is performed as well as the frequency at which the input signal is chopped and the chopped input signal is de-chopped. Control signal ch_b is the inverse of clock signal ch. Control signal ch_b controls switches ch_b of the chopping and autozeroing circuitry 105 and the de-chopping switches 107 of FIG. 2. Control signal ch_cor is the Boolean AND of clock signal ch and signal cor. Control signal ch_cor controls switches ch_cor of the chopping and autozeroing circuitry 105 and the de-chopping switches 107. Control signals ch_cor and ch_b operate to accomplish chopping, by the de-chopping switches 107, of the input offset of the operational amplifier 101 captured during the offset capture interval and autozeroed during the correction interval. Control signals ch_cor and ch_b also operate to accomplish chopping, by the chopping switches 105, of the input signal sampled by the switched capacitor circuitry 103 and to accomplish de-chopping, by the de-chopping switches 107, of the chopped and processed sampled input signal to restore the processed sampled input signal back to the baseband. Control signal ch_cor also opens the first switch ch_cor during the offset capture interval such that (in conjunction with control signal ch_b opening the first switch ch_b) the autozeroing capacitor $C_{az}$ is disconnected from the summing node N making it possible for the autozeroing capacitor $C_{az}$ to capture the input offset.

As shown, a chopping cycle begins with a rising edge of clock signal ch, and the chopping cycle ends at the next rising edge of clock signal ch. As shown, the chopping period is smaller than the autozeroing period such that the chopping of the autozeroed captured offset is performed at a higher frequency than the autozeroing frequency. As also shown, control signal ch_cor is effectively the same as signal ch except that ch_cor is low during the offset capture interval. As a result, during the offset capture interval, the autozeroing capacitor $C_{az}$ is disconnected from the summing node N and connected to the common mode bias voltage $V_{cm}$ so that the autozeroing capacitor $C_{az}$ captures the input offset of the operational amplifier 101. After the offset capture interval, control signal az opens the first switch az to disconnect the autozeroing capacitor $C_{az}$ from the common mode bias voltage $V_{cm}$, and control signal ch_cor goes high to connect the autozeroing capacitor $C_{az}$ to the summing node N. Thus, the ch_cor signal participates in the autozeroing process in addition to participating in the chopping process.

The chopping and de-chopping operations will now be described with respect to a normal chopping cycle. A special chopping cycle that includes an offset capture interval is similar to a normal chopping cycle except for the differences described above and below. As may be observed, the de-chopping switches 107 and the chopping switches of the chopping and autozeroing circuitry 105 are identical and controlled by the same control signals. During the first half of a chopping cycle, control signal ch_cor closes first switch ch_cor to connect the summing node N to the input of the operational amplifier 101 (indirectly through the autozeroing capacitor $C_{az}$), and control signal ch_cor closes second switch ch_cor to connect the output of the operational amplifier 101 to the integrating capacitor $C_i$ and to the output of the system 100. Also, during the first half of a chopping cycle, control signal ch_b opens first switch ch_b to disconnect the opposite summing node N from the input of the operational amplifier 101, and control signal ch_b opens second switch ch_b to disconnect the opposite output of the operational amplifier 101 from the integrating capacitor $C_i$ and from the output of the system 100. During the second half of the chopping cycle, control signal ch_cor opens first switch ch_cor to disconnect the summing node N from the input of the operational amplifier 101, and control signal ch_cor opens second switch ch_cor to disconnect the output of the operational amplifier 101 from the integrating capacitor $C_i$ and from the output of the system 100. Also, during the second half of a chopping cycle, control signal ch_b closes first switch ch_b to connect the opposite summing node N to the input of the operational amplifier 101 (indirectly through the autozeroing capacitor $C_{az}$), and control signal ch_b closes second switch ch_b to connect the opposite output of the operational amplifier 101 to the integrating capacitor $C_i$ and to the output of the system 100. In this way, the sampled input signal is chopped by the chopping switches of the chopping and autozeroing circuitry 105, then processed by the operational amplifier 101 and integrating capacitor $C_i$, and then de-chopped by the de-chopping switches 107 to restore the resulting output signal back to baseband. Further, in this way, the autozeroed captured input offset of the operational amplifier 101 is chopped by the de-chopping switches 107 to reduce the offset in the output signal of the system 100.

During the first half of the chopping period that occurs just prior to the offset capture interval (as well as other chopping periods), control signal ch_cor closes the switch ch_cor to connect the near side of the holding capacitor $C_h$ to the common mode bias voltage $V_{cm}$ which enables the holding capacitor $C_h$ to capture the value of the output of the operational amplifier 101 prior to the offset capture interval. Then, during the offset capture interval, control signal ch_cor opens the switch ch_cor to disconnect the near side of the holding capacitor $C_h$ from the common mode bias voltage $V_{cm}$ and control signal az closes the second switch az to connect the near side of the holding capacitor $C_h$ to the input of the operational amplifier 101 which enables the holding capacitor $C_h$ to hold the output of the operational amplifier 101 at its value prior to being disconnected by operation of the de-chopping switches 107 during the offset capture interval.

In one embodiment, the autozeroing frequency is dithered. That is, the time between pulses of the control signal az is not constant, but instead randomly or pseudo-randomly varied to provide the advantage of avoiding tonal feedback.

Although the autozeroing frequency varies, the autozeroing frequency remains less than the chopping frequency.

As may be observed from FIG. 3 in view of FIG. 2, the chopping switches are wrapped around the autozeroing capacitors and switches such that the chopping of the input offset is performed around the autozeroing of the input offset. Stated alternatively, the autozeroing of the offset is performed inside the chopping of the offset. As may further be observed, a portion of the autozeroing switches are combined with the chopping switches, namely the first ch_cor switch.

Figure 4:
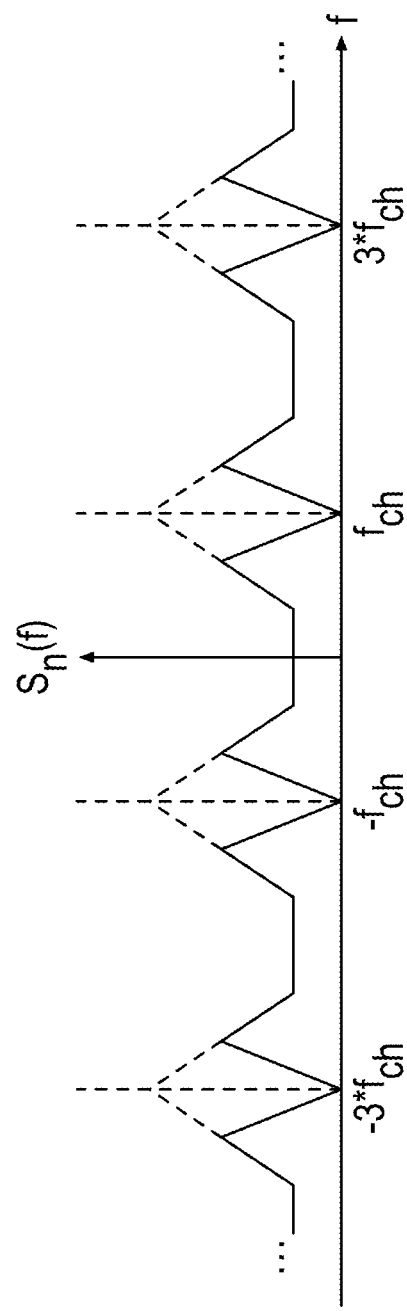
FIG. 4 is an example graph illustrating the effect of hybrid autozeroing and chopping offset cancellation in a switched capacitor operational amplifier system in accordance with an embodiment of the present disclosure.

FIG. 4 is a graph illustrating the effect of hybrid autozeroing and chopping offset cancellation in a switched capacitor operational amplifier system according to an embodiment of the present disclosure, such as the system 100 of FIG. 2 that operates according to the timing diagram of FIG. 3. Similar to FIG. 1, FIG. 4 depicts magnitude of the offset of an operational amplifier in the output signal of the system as a function of frequency. As shown, the autozeroed offset is translated, or spread, to higher frequencies that are odd integer multiples of the chopping frequency. The dotted upward triangles in FIG. 4 represent the energy removed by autozeroing, which may be a significant amount of energy. Even though much of the removed energy may be outside the frequency band of interest, nevertheless removing it is valuable because if non-linearity exists in the system, the energy might have been folded back to the frequency band of interest if not attenuated by autozeroing.

The following additional advantages may be realized by employing embodiments of hybrid autozeroing and chopping offset cancellation circuitry in a switched capacitor operational amplifier-based system as described herein. The addition of autozeroing to chopping may remove the settling requirement needed for chopping when used by itself. The addition of chopping to autozeroing may address the inability of autozeroing alone to cancel upper spectrum flicker noise. The addition of autozeroing to chopping may remove the noise folding effect through non-linearity associated with chopping, as described above. Chopping may significantly reduce thermal noise introduced by autozeroing. Ripple at the summing node introduced by chopping may be reduced by autozeroing. Finally, the use of hybrid autozeroing and chopping offset cancellation circuitry in a switched capacitor operational amplifier system may significantly improve the feedback factor and gate leakage performance, particularly when the operational amplifier is used as an input device of the system.

Figure 5:
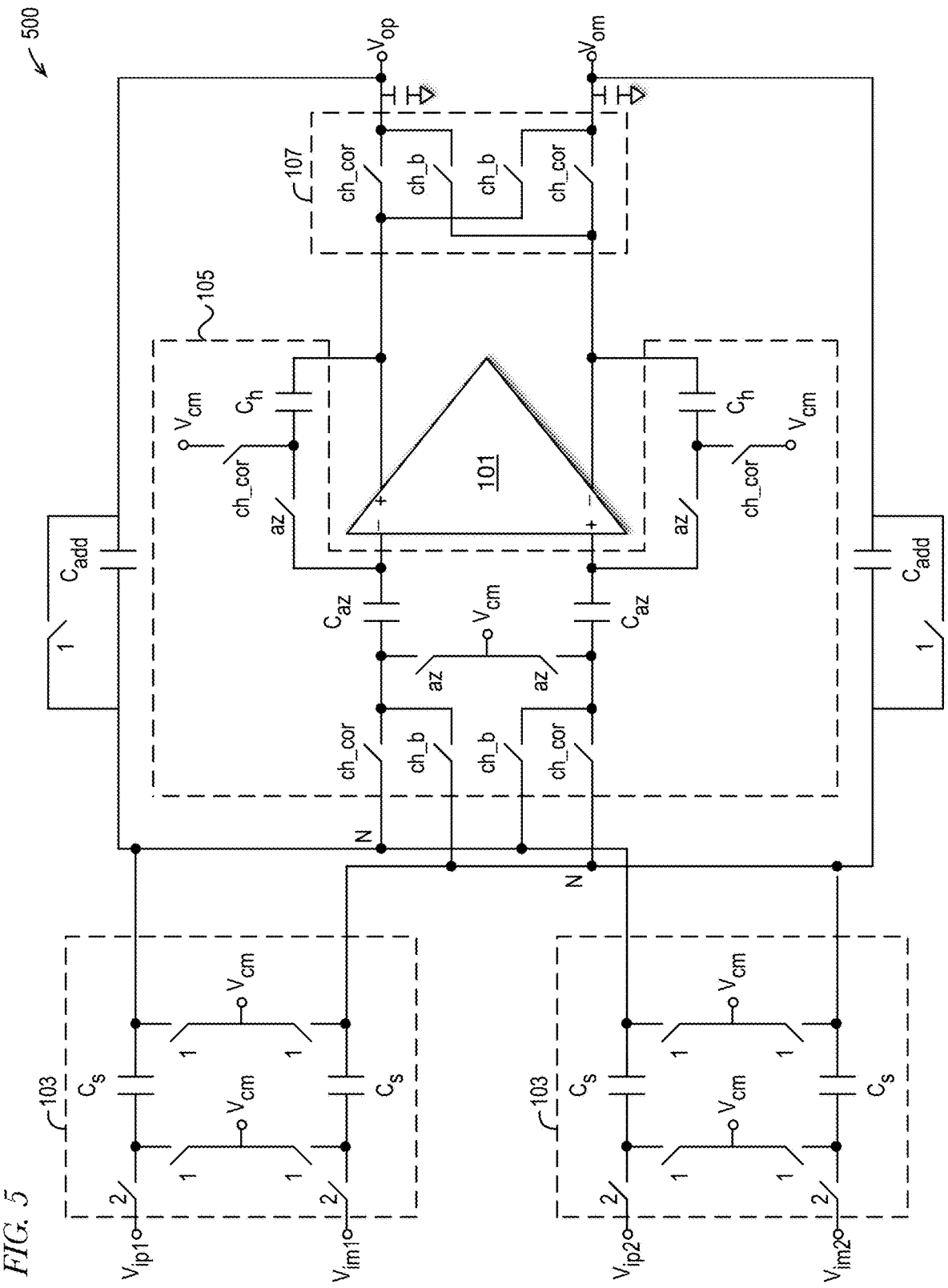
FIG. 5 is an example switched capacitor summer system that performs hybrid autozeroing and chopping of a captured offset of an operational amplifier in accordance with an embodiment of the present disclosure.

FIG. 5 shows an example switched capacitor non-delayed inverting summer system 500 in accordance with an embodiment of the present disclosure. The switched capacitor summer system 500 is similar in many respects to the switched capacitor integrator system 100 of FIG. 1 and may operate according to the timing diagram of FIG. 3. However, differences will now be described. The summer 500 has an adding capacitor $C_{add}$ in place of the integrating capacitor $C_i$ of the integrator 100. The summer 500 also includes another switch 1 in parallel with the adding capacitor $C_{add}$. The summer 500 has two differential voltage input signals $V_{ip1}$ and $V_{im1}$, and $V_{ip2}$ and $V_{im2}$, each having their own respective switched capacitor circuitry 103 whose positive outputs are connected to the positive summing node N and whose negative output are connected to the negative summing node N. The summer 500 includes the chopping and autozeroing circuitry 105 and de-chopping switches 107 as in the integrator 100 to perform hybrid autozeroing and chopping offset cancellation in a manner similar to that described with respect to the integrator 100 in order to appreciate similar advantages to those described with respect to the integrator 100.

Figure 6:
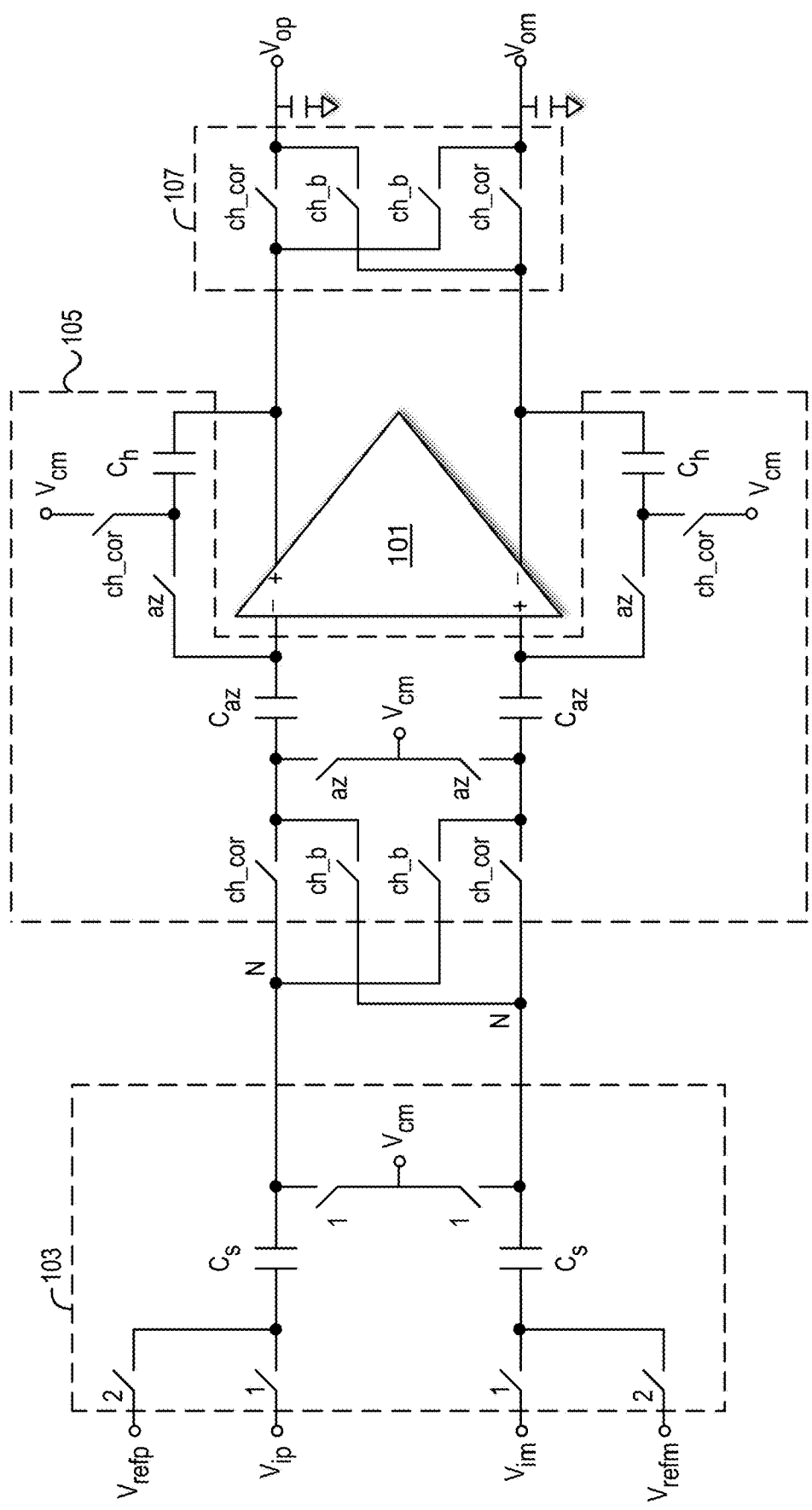
FIG. 6 is an example switched capacitor comparator system that performs hybrid autozeroing and chopping of a captured offset of an operational amplifier in accordance with an embodiment of the present disclosure.

FIG. 6 shows an example switched capacitor non-delayed inverting comparator system 600 in accordance with an embodiment of the present disclosure. The switched capacitor comparator system 600 is similar in many respects to the switched capacitor integrator system 100 of FIG. 1 and may operate according to the timing diagram of FIG. 3. However, differences will now be described. The comparator 600 is absent the integrating capacitor $C_i$ of the integrator 100. The comparator 600 has a differential reference input $V_{refp}$ and $V_{refm}$. The positive reference input $V_{refp}$ is connected to the near side of the positive sampling capacitor $C_s$ through a switch 2, and the negative reference input $V_{refm}$ is connected to the near side of the negative sampling capacitor $C_s$ through a switch 2. The comparator 600 includes the chopping and autozeroing circuitry 105 and de-chopping switches 107 as in the integrator 100 to perform hybrid autozeroing and chopping offset cancellation in a manner similar to that described with respect to the integrator 100 in order to appreciate similar advantages to those described with respect to the integrator 100.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

The invention claimed is:

1. A system that has an output and that receives an input signal, comprising:
an operational amplifier having an input, an output and an offset at the input;
a switched capacitor network that samples the input signal at a switched capacitor frequency;
an autozeroing capacitor connected to the input of the operational amplifier that captures the offset during an offset capture interval according to an autozeroing frequency;
chopping and autozeroing switches, connected between the autozeroing capacitor and the switched capacitor network, that chop the sampled input signal according to a chopping frequency and that autozero the captured offset according to the autozeroing frequency; and
de-chopping switches, connected between the output of the operational amplifier and the output of the system, that operate on the output of the operational amplifier at the chopping frequency to:
chop the autozeroed captured offset; and
de-chop the chopped sampled input signal processed by the operational amplifier.

2. The system of claim 1,
wherein the switched capacitor frequency is higher than the chopping frequency, and the chopping frequency is higher than the autozeroing frequency.

3. The system of claim 1,
wherein the autozeroing frequency is dithered.

4. The system of claim 1, further comprising:
an autozeroing clock signal that controls an autozeroing switch that operates to capture the offset on the autozeroing capacitor according to the autozeroing frequency;
a switched capacitor clock signal that controls the switched capacitor network according to the switched capacitor frequency;
wherein the autozeroing clock signal has a low duty cycle relative to a duty cycle of the switched capacitor clock signal.

5. The system of claim 1, further comprising:
a summing node that connects the switched capacitor network, the chopping and autozero switches, and a feedback path from the output of the system;
a chopping clock signal that controls the chopping and de-chopping switches according to the chopping frequency;
an autozeroing clock signal that controls an autozeroing switch that operates to capture the offset on the autozeroing capacitor according to the autozeroing frequency; and
wherein the chopping and autozeroing switches comprise a switch that when closed connects the autozeroing capacitor to the summing node, and wherein the switch is controlled by a control signal that is a Boolean AND of the chopping clock signal and an inverted version of the autozeroing clock signal.

6. The system of claim 1, further comprising:
a holding capacitor connected on one side to the output of the operational amplifier; and
wherein the chopping and autozeroing switches further operate to connect the other side of the holding capacitor to the input of the operational amplifier during the offset capture interval.

7. The system of claim 6,
wherein the de-chopping switches operate to disconnect the output of the operational amplifier from a feedback path to the switched capacitor network during the offset capture interval; and
wherein the chopping and autozeroing switches further operate to make the holding capacitor hold a value of the output of the operational amplifier prior to the offset capture interval.

8. The system of claim 1,
wherein the operational amplifier comprises an operational transconductance amplifier (OTA).

9. The system of claim 1, further comprising:
an integrating capacitor connected on one side between the switched capacitor network and the chopping and autozeroing switches and connected on the other side between the de-chopping switches and the output of the system; and
wherein the system is an integrator having the offset reduced at its output.

10. The system of claim 1, further comprising:
a wire connecting a first node to which the switched capacitor network and the chopping and autozeroing switches are connected to a second node to which the de-chopping switches and the output of the system are connected; and
wherein the system is a buffer having the offset reduced at its output.

11. The system of claim 1, further comprising:
a resistor connected on one side between the switched capacitor network and the chopping and autozeroing switches and connected on the other side between the de-chopping switches and the output of the system; and
wherein the system is a gain stage having the offset reduced at its output.

12. A method for cancelling an offset at an input of an operational amplifier in a system also having a switched capacitor network that receives an input signal, comprising:
sampling, by the switched capacitor network, the input signal at a switched capacitor frequency;
capturing, by an autozeroing capacitor, the offset during an offset capture interval according to an autozeroing frequency;
chopping the sampled input signal according to a chopping frequency and autozeroing the captured offset according to the autozeroing frequency;
chopping, at the chopping frequency, the autozeroed captured offset at an output of the operational amplifier; and
de-chopping, at the chopping frequency, the chopped sampled input signal processed by the operational amplifier.

13. The method of claim 12,
wherein the switched capacitor frequency is higher than the chopping frequency, and the chopping frequency is higher than the autozeroing frequency.

14. The method of claim 12,
wherein the autozeroing frequency is dithered.

15. The method of claim 12, further comprising:
generating a first clock signal that controls an autozeroing switch that captures the offset on the autozeroing capacitor according to the autozeroing frequency; and
wherein the autozeroing clock signal has a low duty cycle relative to a duty cycle of a second clock signal that controls the switched capacitor network.

16. The method of claim 12, further comprising:
generating a control signal that controls a switch that when closed connects the autozeroing capacitor to a summing node that connects the switched capacitor network, chopping and autozero switches, and a feedback path from the output of the system;
wherein the control signal is a Boolean AND of a chopping clock signal and an inverted version of an autozeroing clock signal;
wherein the chopping clock signal controls switches that perform said chopping and de-chopping at the chopping frequency; and
wherein the autozeroing clock signal controls a switch that performs said capturing, by the autozeroing capacitor, the offset according to the autozeroing frequency.

17. The method of claim 12, further comprising:
wherein the system also includes a holding capacitor connected on one side to the output of the operational amplifier; and
controlling a switch to connect the other side of the holding capacitor to the input of the operational amplifier during the offset capture interval.

18. The method of claim 17, further comprising:
disconnecting the output of the operational amplifier from a feedback path to the switched capacitor network during the offset capture interval; and
holding, by the holding capacitor, a value of the output of the operational amplifier prior to the offset capture interval.

19. The method of claim 12,
wherein the operational amplifier comprises an operational transconductance amplifier (OTA).

20. The method of claim 12,
wherein the system is an integrator, a gain stage, or a buffer having the offset reduced at its output.

21. The method of claim 12,
wherein the system also includes chopping and autozeroing switches, connected between the autozeroing capacitor and the switched capacitor network, that perform said capturing the offset during the offset capture interval and said chopping the sampled input signal and autozeroing the captured offset; and
wherein the system also includes de-chopping switches, connected between the output of the operational amplifier and the output of the system, that perform said chopping the autozeroed captured offset at an output of the operational amplifier and said de-chopping the chopped sampled input signal processed by the operational amplifier.

* * * * *